(12) United States Patent
Han et al.

(10) Patent No.: US 11,047,682 B2
(45) Date of Patent: Jun. 29, 2021

(54) EXTENDED KALMAN FILTER BASED AUTONOMOUS MAGNETOMETER CALIBRATION

(71) Applicant: Intel Corporation, Santa Clara, CA (US)

(72) Inventors: Ke Han, Shanghai (CN); He Han, Shanghai (CN); Zhifeng Wang, Shanghai (CN); Feng Xu, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 639 days.

(21) Appl. No.: 15/523,908

(22) PCT Filed: Nov. 11, 2014

(86) PCT No.: PCT/CN2014/090817
§ 371 (c)(1),
(2) Date: May 2, 2017

(87) PCT Pub. No.: WO2016/074153
PCT Pub. Date: May 19, 2016

(65) Prior Publication Data
US 2017/0343349 A1 Nov. 30, 2017

(51) Int. Cl.
*G01C 17/38* (2006.01)
*G01R 33/00* (2006.01)
(Continued)

(52) U.S. Cl.
CPC ............ *G01C 17/38* (2013.01); *G01C 19/56* (2013.01); *G01C 25/005* (2013.01); *G01R 33/00* (2013.01);
(Continued)

(58) Field of Classification Search
CPC ........ G01C 17/00; G01C 17/02; G01C 17/38; G01C 25/00; G01C 25/005; G01C 19/56;
(Continued)

(56) References Cited

U.S. PATENT DOCUMENTS 4,327,498 A   5/1982  Setter et al.
7,451,549 B1* 11/2008  Sodhi .................... G01C 17/38
                                                33/356
(Continued)

FOREIGN PATENT DOCUMENTS

CN   101782391 A   7/2010
CN   102445200 A   5/2012
(Continued)

OTHER PUBLICATIONS

European Search Report for European Patent Application No. 14906042.8, dated Mar. 26, 2019, 6 pages.
(Continued)

*Primary Examiner* — Huy Q Phan
*Assistant Examiner* — David B Frederiksen
(74) *Attorney, Agent, or Firm* — Jordan IP Law, LLC (57) ABSTRACT

Systems and methods may provide for obtaining first sensor data associated with a gyroscope and obtaining second sensor data associated with a magnetometer. Additionally, the first sensor data, the second sensor data and an extended Kalman filter may be used to calibrate the magnetometer. In one example, a sampling rate of the magnetometer is increased before obtaining the second sensor data and the sampling rate of the magnetometer is decreased after calibration of the magnetometer.

24 Claims, 4 Drawing Sheets

(51) Int. Cl.
*G01C 25/00* (2006.01)
*G01R 33/028* (2006.01)
*G01C 19/56* (2012.01)
*G01R 33/022* (2006.01)

(52) U.S. Cl.
CPC ....... *G01R 33/0035* (2013.01); *G01R 33/022* (2013.01); *G01R 33/028* (2013.01)

(58) Field of Classification Search
CPC G01R 33/00; G01R 33/0023; G01R 33/0029; G01R 33/0035; G01R 33/02; G01R 33/022; G01R 33/028
See application file for complete search history.

(56) References Cited

U.S. PATENT DOCUMENTS

| | | | |
|---|---|---|---|
| 8,768,647 B1* | 7/2014 | Zaki | G01C 21/16 |
| | | | 702/150 |
| 2011/0066392 A1* | 3/2011 | Judd | G01C 17/38 |
| | | | 702/93 |
| 2011/0167893 A1 | 7/2011 | Frey, Jr. | |
| 2011/0248704 A1 | 10/2011 | Chowdhary et al. | |
| 2012/0197138 A1* | 8/2012 | Vrazic | A61B 5/1102 |
| | | | 600/484 |
| 2012/0271582 A1* | 10/2012 | Bageshwar | G01R 33/0035 |
| | | | 702/92 |
| 2013/0106697 A1 | 5/2013 | Kulik | |
| 2013/0124126 A1 | 5/2013 | Ahuja et al. | |
| 2013/0158928 A1 | 6/2013 | Hogdal | |
| 2013/0174636 A1 | 7/2013 | Joseph | |
| 2013/0185018 A1 | 7/2013 | Sheng | |
| 2013/0253880 A1* | 9/2013 | Joseph | G01C 19/5776 |
| | | | 702/150 |
| 2013/0320966 A1* | 12/2013 | Oliver | G01R 33/0035 |
| | | | 324/202 |
| 2014/0020445 A1* | 1/2014 | Waters | G01D 18/00 |
| | | | 73/1.75 |
| 2014/0150521 A1* | 6/2014 | Jacobson | G01P 21/00 |
| | | | 73/1.38 |
| 2014/0266160 A1* | 9/2014 | Coza | G01C 21/08 |
| | | | 324/207.11 |
| 2014/0278183 A1 | 9/2014 | Yuan et al. | |
| 2015/0019159 A1* | 1/2015 | Elgersma | G01R 35/005 |
| | | | 702/150 |
| 2015/0177020 A1* | 6/2015 | An | G01C 17/38 |
| | | | 702/92 |
| 2015/0241390 A1* | 8/2015 | Figaro | G01N 19/00 |
| | | | 702/65 |
| 2015/0285835 A1* | 10/2015 | Karahan | G01R 35/005 |
| | | | 73/1.38 |
| 2015/0354980 A1* | 12/2015 | Wahdan | G01C 17/38 |
| | | | 324/202 |
| 2017/0160086 A1* | 6/2017 | Kesaniemi | G01R 33/0035 |

FOREIGN PATENT DOCUMENTS

| | | |
|---|---|---|
| CN | 102745592 A | 10/2012 |
| CN | 103105176 A | 5/2013 |
| CN | 103153790 A | 6/2013 |
| CN | 103900613 A | 7/2014 |
| CN | 103946670 A | 7/2014 |
| EP | 2677275 A2 | 12/2013 |
| JP | S60122311 A | 6/1985 |
| JP | 2013057551 A | 3/2013 |
| TW | 201411096 A | 3/2014 |
| WO | 20130066891 A2 | 5/2013 |
| WO | 20140074258 A1 | 5/2014 |

OTHER PUBLICATIONS

European Search Report for European Patent Application No. 14906042.8, dated Jun. 5, 2018, 8 pages.

International Search Report and Written Opinion for International Patent Application No. PCT/CN2014/090817, dated Aug. 5, 2015, 12 pages.

Office Action for Japanese Patent Application No. JP2017-522175, dated Jun. 5, 2018, 11 pages including 5 pages of English translation.

Office Action for Taiwanese Patent Application No. 104132705, dated Nov. 17, 2016, 17 pages including 10 pages of English translation.

Ke Han, "Magnetometer Compensation Scheme and Experimental Results on ZDPS-1A Pico-satellite", Chinese Journal of Aeronautics, vol. 25, Issue 3, 2012, pp. 430-436.

* cited by examiner

EXTENDED KALMAN FILTER BASED AUTONOMOUS MAGNETOMETER CALIBRATION

CROSS-REFERENCE TO RELATED APPLICATIONS

The present application is a U.S. National Phase Patent Application which claims benefit to International Patent Application No. PCT/CN2014/090817 filed on Nov. 11, 2014.

TECHNICAL FIELD

Embodiments generally relate to magnetometer calibration. More particularly, embodiments relate to extended Kalman filter (EKF) based autonomous magnetometer calibration.

BACKGROUND

Magnetometers may generally be used to measure the strength and direction of the magnetic fields. In particular, miniaturized magnetometers may be used as compasses in handheld devices such as smart phones and tablet computers. The sensitivity of miniaturized magnetometers to other magnetic objects, however, may have a negative impact on accuracy. For example, magnetized ferromagnetic components mounted on nearby printed circuit boards (PCBs) may produce a "hard-iron effect" on a magnetometer in a handheld device. Moreover, a "soft-iron effect" may result from the Earth's magnetic field inducing an interfering magnetic field onto normally un-magnetized ferromagnetic components of nearby PCBs. Both the hard-iron effect and the soft-iron effect may cause the measurements of the magnetometer to form an ellipsoid in three dimensional (3D) space rather than a sphere.

While conventional "ellipsoid fitting" solutions may attempt to determine optimized calibration parameters for the magnetometer in order to reposition raw measurement points from the surface of an ellipsoid to the surface of a sphere, there remains considerable room for improvement. For example, if the measurement data set from the magnetometer is either small or unevenly distributed, "overfitting" may occur, which can in turn worsen the calibration results. Additionally, conventional ellipsoid fitting solutions may prompt the user of the device to perform awkward, inconvenient and/or complex gestures such as "Figure 8" motions with the handheld device. Moreover, conventional ellipsoid fitting solutions may rely upon manual triggering, which can further have a negative impact on the user experience.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Figure 1:
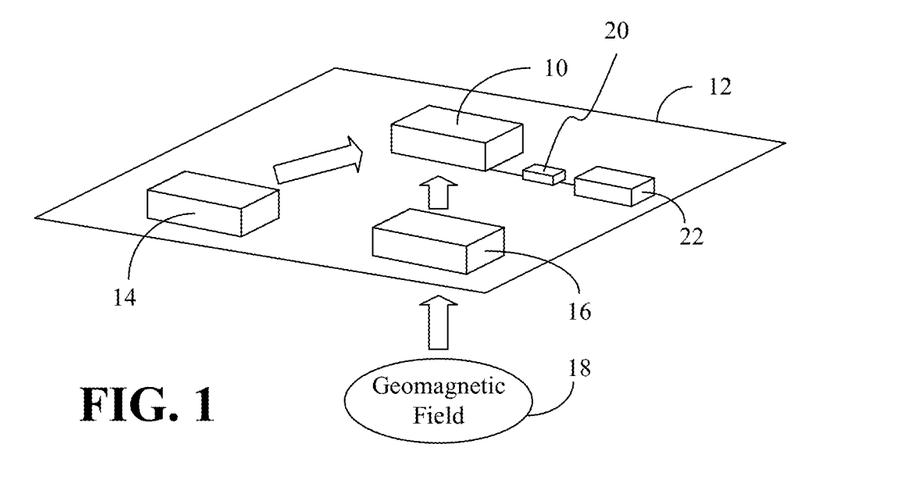
FIG. 1 is an illustration of an example of a magnetometer calibration environment according to an embodiment.

Turning now to FIG. 1, an environment is shown in which a magnetometer 10 (e.g., implemented in a microelectrical mechanical system/MEMS chip) is calibrated autonomously. In the illustrated example, the magnetometer 10 is mounted to a printed circuit board (PCB) 12, which also includes one or more hard-iron effect components 14 (e.g., speaker magnets) and one or more soft-iron effect components 16 (e.g., electromagnetic interference/EMI shields, screws, battery contacts). The hard-iron effect components 14 may be magnetized ferromagnetic components that impact the measurement accuracy of the magnetometer 10. The soft-iron effect components 16 may be normally un-magnetized ferromagnetic components that also impact the measurement accuracy of the magnetometer 10 due to an interfering magnetic field that is induced on the soft-iron effect components 16 by a geomagnetic field 18. The illustrated magnetometer 10 is coupled to a calibration apparatus 20 that uses sensor data from the magnetometer 10, sensor data from a gyroscope 22 and an extended Kalman filter (EKF) to calibrate the magnetometer 10.

As will be discussed in greater detail, the calibration apparatus 20 may provide a unique technical application of two observations: 1) In the same location, the magnitude of the environmental magnetic field is constant, regardless of the device's orientation; and 2) The change of a calibrated magnetometer measurement aligns with the change of the device orientation, which may be measured via a gyroscope. More particularly, both the hard-iron effect and the soft-iron effect may be determined and/or quantified in real time based on the two observations. As a result, the illustrated approach enables effective calibration for small and unevenly distributed measurement data sets without inconvenient or complex gestures being required from the user. Indeed, the illustrated solution may enable automatic triggering of calibration operations that run in the background (e.g., are transparent to the user).

Figure 2:
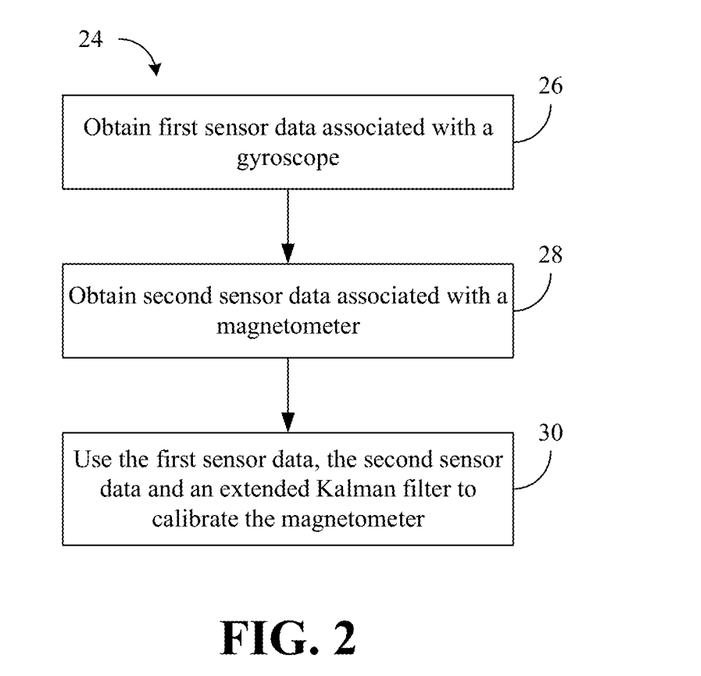
FIGS. 2 and 3 are flowcharts of examples of methods of operating a calibration apparatus according to embodiments.

FIG. 2 shows a method 24 of operating a calibration apparatus. The method 24 may generally be implemented in a calibration apparatus such as the calibration apparatus 20 (FIG. 1), already discussed. More particularly, the method 24 may be implemented as one or more modules in a set of logic instructions stored in a machine- or computer-readable storage medium such as random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality hardware logic using circuit technology such as, for example, application specific integrated circuit (ASIC), complementary metal oxide semiconductor (CMOS) or transistor-transistor logic (TTL) technology, or any combination thereof. Illustrated processing block 26 provides for obtaining first sensor data associated with a gyroscope, wherein second sensor data associated with a magnetometer may be obtained at block 28. Block 30 may use the first sensor data, the second sensor data and an EKF to calibrate the magnetometer.

As will be discussed in greater detail, block 30 may include determining one or more soft-iron calibration parameters and one or more hard-iron calibration parameters for the EKF. More particularly, block 30 may use a magnetometer measurement model that is written as, $$B_p = AB + b_{sensor} + \varepsilon \qquad (1)$$

In which, $B_p$ is the magnetometer sensor measurement;

A is the rotation matrix of the device from the Earth coordinate to a body coordinate;

B is the magnetic field in the Earth coordinate. By definition, it may be [0, by, bz], wherein by and bz may be calculated from a test location in accordance with the Earth's magnetic field model;

$b_{sensor}$ is the measurement bias of the magnetometer (it may be a constant value);

ε is the measurement error of the magnetometer (it may be modeled by white noise).

Soft- and Hard-Iron Effect:

As already discussed, magnetometers may be impacted by the hard-iron and soft-iron effect. Considering these interferences, the measurement model may be re-written as, $$B_p = WAB + b + \varepsilon_m \quad (2)$$

In which, $$W = W_{nonOrth} W_{gain} W_{soft} \quad (3)$$

$$b = b_{sensor} + b_{PCB} \quad (4)$$

Where, W is a three-by-three symmetric matrix that includes the non-orthogonal error matrix $W_{nonOrth}$, the gain error matrix $W_{gain}$, and the soft-iron effect matrix $W_{soft}$; b is the three-by-one hard-iron matrix that includes a bias $b_{sensor}$ from the sensor, and the hard-iron effect $b_{PCB}$ from the printed circuit board.

With equation (2), if W and b are known, a calibrated measurement may be readily defined as, $$B_{cal} = AB = W^{-1}(B_p - b) \quad (5)$$

Observation #1—Constant Magnitude:

As already noted, an observation may be made that in the same location, the magnitude of the environmental magnetic field is constant, regardless of the device's orientation. Therefore, the following equation may be formulated, $$B_{cal}^T B_{cal} = (B_p - b)^T (W^{-1})^T W^{-1} (B_p - b) = \text{constant} \quad (6)$$

The above-equation may be a general expression defining the locus of the vector $B_p$ lying on the surface of an ellipsoid with a center at b. Therefore, ellipsoid fitting algorithms can be applied to obtain the calibration parameters W and b.

Observation #2—Gyroscope Alignment:

Because conventional ellipsoid fitting techniques may have practical limitations, another observation may be made that the change of a calibrated magnetometer measurement aligns with the change of the device orientation, which may be measured via a gyroscope. Therefore, the following equation may be formulated, $$A_{k+1}^T B_{cal,k+1} = A_k^T B_{cal,k} \quad (7)$$

$$A_{k+1} = A_k + \begin{bmatrix} 0 & -\omega_z & \omega_y \\ \omega_z & 0 & -\omega_x \\ -\omega_y & \omega_x & 0 \end{bmatrix} A_k dt \quad (8)$$

In which, $A_k$ and $A_{k+1}$ are the rotation matrix A at times k and k+1;

$B_{cal,k}$ and $B_{cal,k+1}$ are calibrated magnetometer measurements at time k and k+1;

$\omega_x$, $\omega_y$, $\omega_z$ are a three-axis calibrated gyroscope measurement; and dt is the time interval between time k and k+1.

Extended Kalman Filter (EKF) Calibration:

With observation #1 and observation #2, a Kalman filter state may be defined as, $$X_k = [B_{cal,k} W_{11} W_{22} W_{33} W_{12} W_{13} W_{23} b] \quad (9)$$

In which, $W_{11}$-$W_{23}$ are elements of the soft-iron matrix W. The state transition model may therefore be written as, $$B_{cal,k+1} = \begin{bmatrix} 1 & -\omega_{z,k} & \omega_{y,k} \\ \omega_{z,k} & 1 & -\omega_{x,k} \\ -\omega_{y,k} & \omega_{x,k} & 1 \end{bmatrix} B_{cal,k} + \begin{bmatrix} 0 & \varepsilon_\omega & \varepsilon_\omega \\ \varepsilon_\omega & 0 & \varepsilon_\omega \\ \varepsilon_\omega & \varepsilon_\omega & 0 \end{bmatrix} B_{cal,k} \quad (10)$$

$$W = \text{constant} \quad (11)$$

$$b = \text{constant} \quad (12)$$

In which, $\omega_{x,k}$, $\omega_{x,k}$, $\omega_{x,k}$, are calibrated gyroscope values at time k; and $\varepsilon_\omega$ is the measurement noise of the calibrated gyroscope. The observation model may therefore be written as, $$B_{p,k+1} = W B_{cal,k+1} + b + \varepsilon_m \quad (13)$$

In which $B_{p,k+1}$ is the un-calibrated magnetometer measurement at time k+1.

With the linear state transition equations (10)-(12) and the non-linear observation function (13), EKF equations may be applied to determine the calibrated magnetometer measurement, the soft-iron matrix and the hard-iron vector.

Measurement Quality Assessments:

After an ideal calibration, all calibrated magnetometer measurements may be located on a sphere surface. Accordingly, the standard deviation of the magnitude of magnetometer measurements may be used to conduct a calibration quality analysis, $$\text{Quality\_Index} = \frac{std(\text{magnitude\_of\_calibration\_meas})}{mean(\text{magnitude\_of\_calibration\_meas})} \quad (14)$$

Approximately, the quality index may be transferred to an angular measurement error by, $$\text{Error} \approx a \sin(\text{Quality\_Index}) \quad (15)$$

Figure 5:
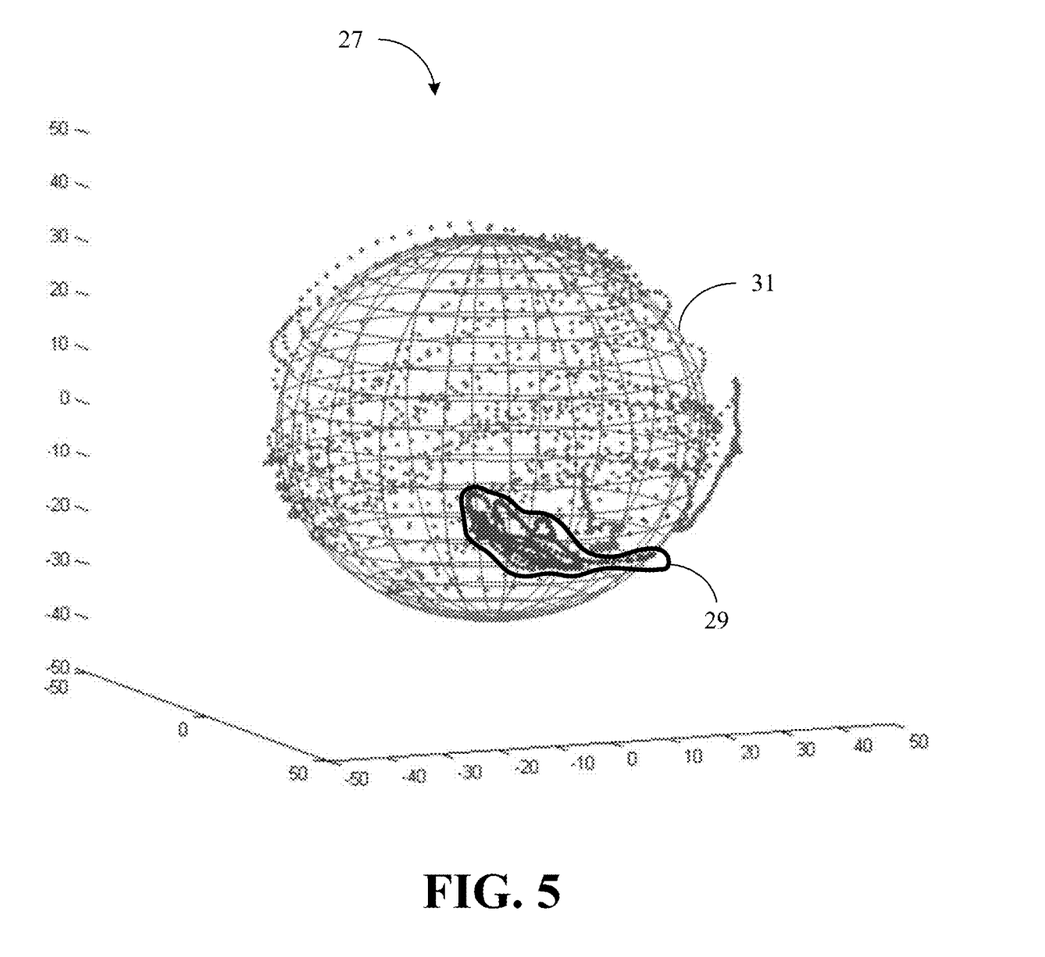
FIG. 5 is an illustration of an example of a calibration result according to an embodiment.

FIG. 5 shows a calibration result 27 from a daily usage scenario. In the illustrated example, a calibration data set 29 is collected during typical pick-up and put-down motions with respect to a device (e.g., over a relatively short timeframe such as, for example, 5 s) and the calibration data set 29 is used to determine calibration parameters for the magnetometer. The remaining points in the illustrated view represent a test data set captured during a Figure 8 motion (e.g., over a longer timeframe such as, for example, 30 s). Of particular note is that the test data set aligns well with a calibrated sphere 31 even though the motions of the calibration data set 29 involve minimal rotational movement and cover only a small area in the calibration space.

Figure 3:
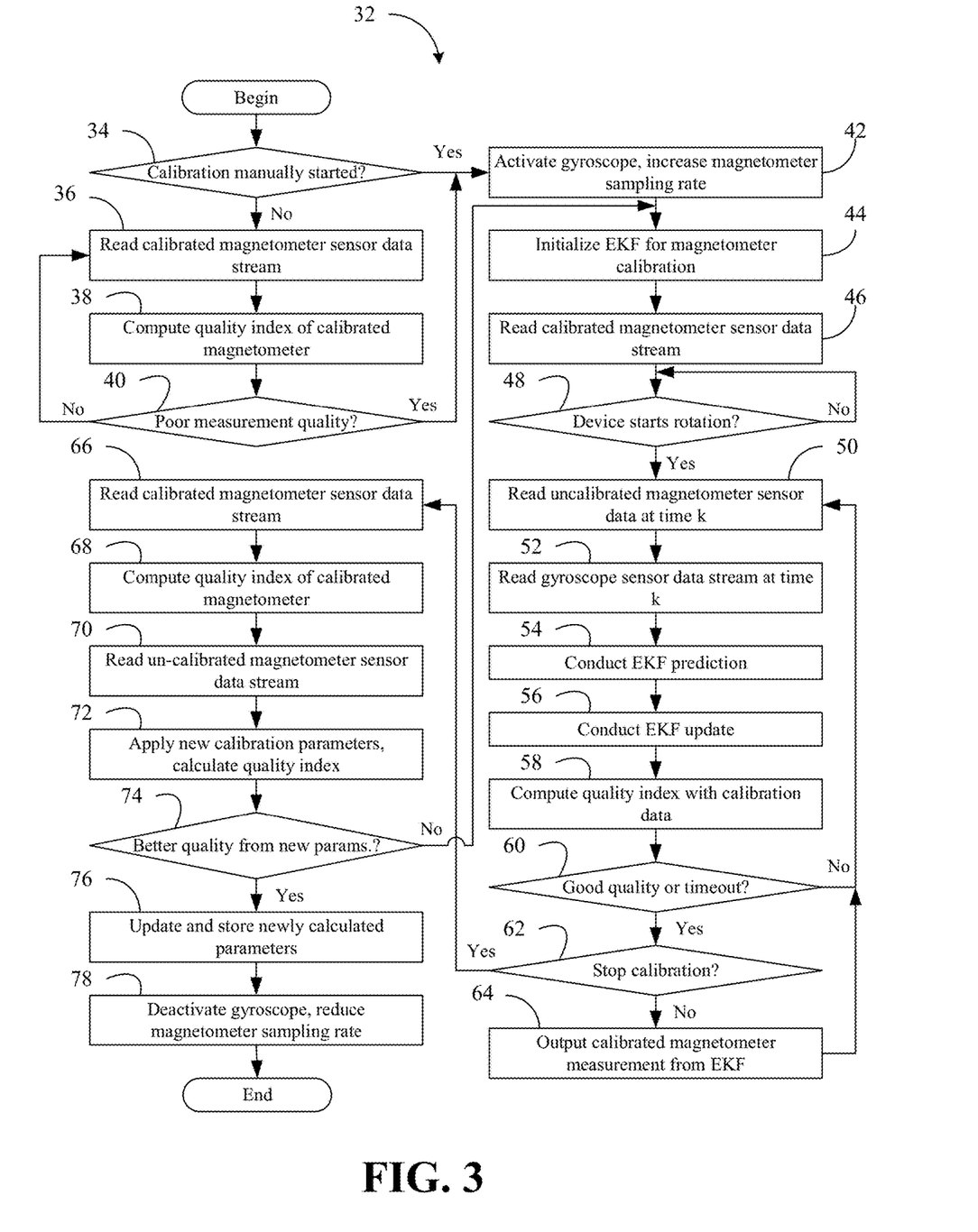

Turning now to FIG. 3, a more detailed method 32 of calibrating magnetometers is shown. The method 32 may generally be implemented in a calibration apparatus such as, for example, the calibration apparatus 20 (FIG. 1), already discussed. More particularly, the method 32 may be implemented as one or more modules in a set of logic instructions stored in a machine- or computer-readable storage medium such as RAM, ROM, PROM, firmware, flash memory, etc., in configurable logic such as, for example, PLAs, FPGAs, CPLDs, in fixed-functionality hardware logic using circuit technology such as, for example, ASIC, CMOS or TTL technology, or any combination thereof.

Illustrated processing block 34 determines whether a calibration has been started manually (e.g., in response to a user request). If not, a calibrated magnetometer sensor data stream may be read at block 36, wherein the quality index of the calibrated magnetometer sensor may be computed at block 38. Block 38 might involve the use of an expression such as, for example, Equation (14), already discussed. A determination may be made at block 40 as to whether the measurement quality of the magnetometer is poor (e.g., has fallen below a particular threshold). If not, the reading of the magnetometer sensor data stream may be repeated at block 36. If either the measurement quality of the magnetometer is poor or a calibration has been started manually, illustrated block 42 activates a gyroscope and increases the sampling rate of the magnetometer. In this regard, maintaining the gyroscope in a powered off state when the magnetometer is not being calibrated may conserve power and/or extend battery life. Additionally, the magnetometer may be operated at a relatively low sampling rate (e.g., 1 Hz) during normal operation or when determining whether to automatically trigger a calibration, and operated a higher sampling rate (e.g., 100 Hz) during calibration. Such an approach may further conserve power and/or extend battery life while ensuring optimal accuracy.

An extended Kalman filter (EKF) may be initialized at block 44, wherein illustrated block 46 reads the calibrated magnetometer sensor data stream. A determination may be made at block 48 as to whether the device (e.g., the handheld device and/or system containing the magnetometer and gyroscope) has started rotational movement. If not, block 48 may be repeated. Once rotation is detected, block 50 may read the un-calibrated magnetometer sensor data stream (e.g., sensor data without calibration parameters being applied to the magnetometer) at time k. In addition, illustrated block 52 provides for reading the gyroscope sensor data stream at time k. As will be discussed in greater detail, the gyroscope sensor data stream may be either calibrated or un-calibrated. An EKF prediction may be conducted at block 54, wherein the EKF may be updated/corrected at block 56. In the case of an un-calibrated gyroscope, block 56 might also include calibrating an offset of the gyroscope.

EKF Calibration Considering Gyroscope Bias:

An un-calibrated gyroscope may have a linear state transition model that enables it to be automatically calibrated along with the magnetometer. Such an approach may yield even better performance. More particularly, a state vector may be selected as, $$X_k = [B_{cal,k} W_{11} W_{22} W_{33} W_{12} W_{13} W_{23} b b_\omega] \quad (16)$$

In which, $b_\omega$ is the offset vector of the gyroscope measurement.

Accordingly, the state transition module may be written as, $$B_{cal,k+1} = \begin{bmatrix} 1 & -\omega_{z,k} + b_{z\varpi,k} & \omega_{y,k} - b_{y\varpi,k} \\ \omega_{z,k} - b_{z\varpi,k} & 1 & -\omega_{x,k} + b_{x\varpi,k} \\ -\omega_{y,k} + b_{y\varpi,k} & \omega_{x,k} - b_{x\varpi,k} & 1 \end{bmatrix} \quad (17)$$

$$B_{cal,k} + \begin{bmatrix} 0 & \varepsilon_\omega & \varepsilon_\omega \\ \varepsilon_\omega & 0 & \varepsilon_\omega \\ \varepsilon_\omega & \varepsilon_\omega & 0 \end{bmatrix} B_{cal,k}$$

-continued $$W = \text{constant} \quad (18)$$
$$b = \text{constant} \quad (19)$$
$$b_\omega = \varepsilon_b \quad (20)$$

In which, $b_{xw,k}$, $b_{yw,k}$, $b_{zw,k}$, are elements of $b_\omega$ at time k; and
$\varepsilon_b$ is the offset instability noise of $b_\omega$.

The observation model may be the same as Equation (13). With the above models, the EKF may be applied to the gyroscope calibration process.

Block 58 may compute a quality index with the calibration data/parameters obtained from blocks 54 and 56. Block 58 may therefore involve the use of an expression such as, for example, Equation (14), already discussed.

Illustrated block 60 determines whether the quality of the new calibration parameters is sufficiently good or a timeout has occurred. If not, block 50 may be repeated. If either the quality of the new calibration parameters is sufficiently good or a timeout has occurred, a determination may be made at block 62 as to whether the calibration is to stop. If not, block 64 may output the calibrated magnetometer measurement from the EKF (e.g., having relatively low measurement noise) and return to block 50. If the calibration is to be stopped, illustrated block 66 reads the calibrated magnetometer sensor data stream (e.g., with the old calibration parameters) and illustrated block 68 computes the quality index of the calibrated magnetometer. Additionally, the un-calibrated magnetometer sensor data stream may be read at block 70, wherein illustrated block 72 provides for applying the new calibration parameters and calculating the quality index.

If it is determined at block 74 that better quality results from the new calibration parameters, block 76 may update and store the newly calculated calibration parameters. Additionally, illustrated block 78 deactivates the gyroscope and reduces the sampling rate of the magnetometer. If it is determined at block 74 that better quality does not result from the new calibration parameters, block 74 may repeat initialization of the EKF at block 44.

Figure 4:
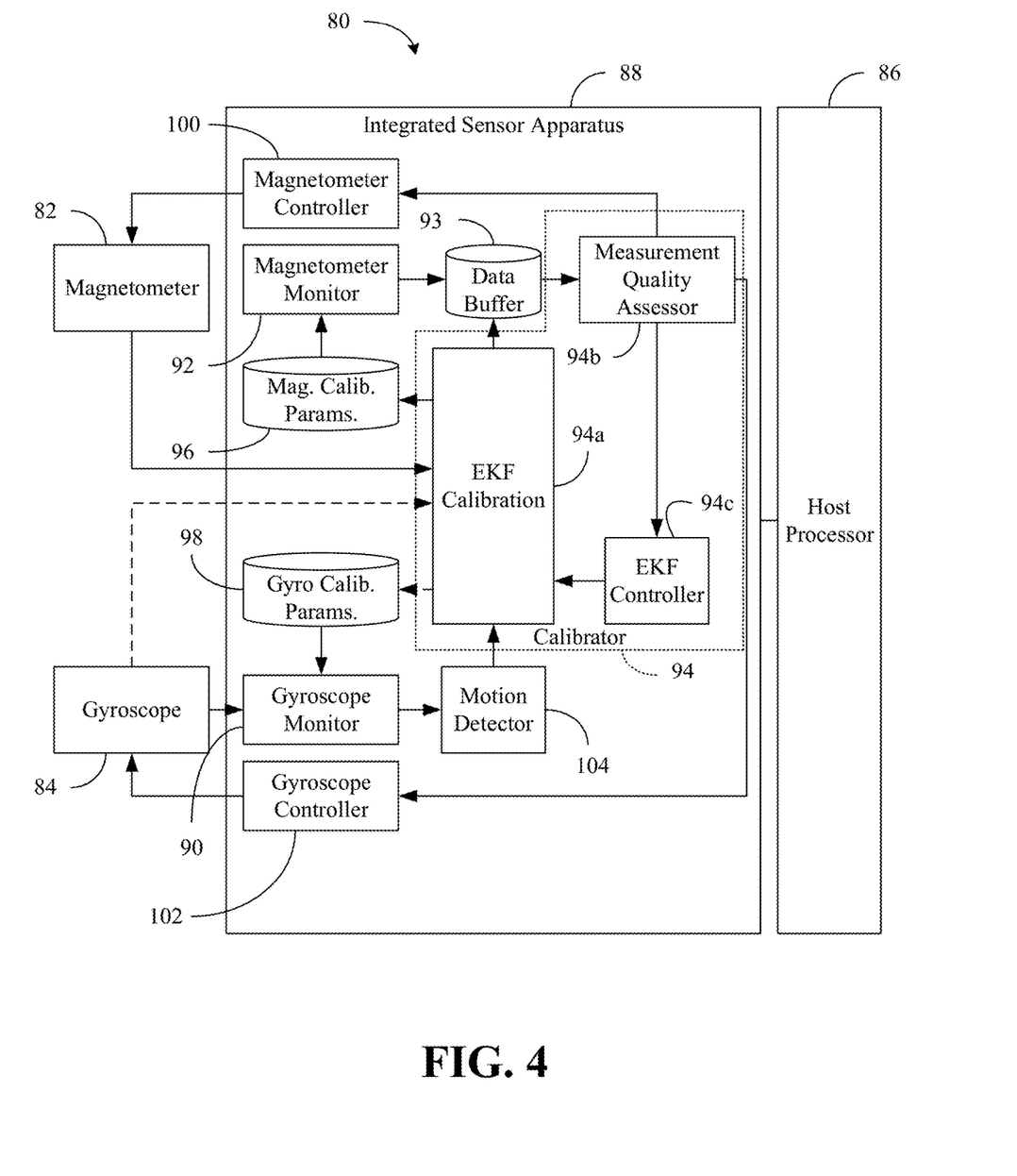
FIG. 4 is a block diagram of an example of a system according to an embodiment.

FIG. 4 shows a geomagnetic field measurement system 80. The illustrated system 80 may be part of a mobile device such as, for example, a notebook computer, tablet computer, convertible tablet, smart phone, personal digital assistant (PDA), mobile Internet device (MID), wearable computer, media player, etc., or any combination thereof. The system 80 may include a magnetometer 82, a gyroscope 84, a host processor 86 (e.g., central processing unit/CPU) and an integrated sensor apparatus 88. The system 80 may also include one or more circuit boards having one or more hard-iron effect components such as, for example, the hard-iron effect components 14 (FIG. 1), and/or one or more soft-iron effect components such as, for example, the soft-iron effect components 16 (FIG. 1).

The illustrated integrated sensor apparatus 88, which may generally operate continuously under relatively low power, includes a gyroscope monitor 90 to obtain first sensor data associated with the gyroscope 84 and a magnetometer monitor 92 to obtain second sensor data associated with the magnetometer 82. The gyroscope 84 may either maintain a uniform sampling rate or use high precision timestamps in order to ensure calibration accuracy. The illustrated magnetometer 82 stores the second sensor data to a data buffer 93. Additionally, a calibrator 94 (94a-94c) may use the first sensor data, the second sensor data and an EKF to calibrate the magnetometer 82. More particularly, the illustrated calibrator 94 uses an EKF calibration component 94a to perform core calibration computations, a measurement quality assessor 94b to determine whether calibrated magnetometer measurements are sufficiently good/accurate, and an EKF controller 94c. The illustrated calibration component 94a stores the results of the core calibrations to the data buffer 93 as well as to magnetometer storage 96. The EKF controller 94c may enable/activate the EKF calibration component 94a if the magnetometer measurement quality is poor, disable/deactivate the EKF calibration component 94a if the calibration result is acceptable or a calibration timeout has occurred, and restart the EKF calibration component 94a if the calibration results are worse than with previous calibration parameters.

The magnetometer storage 96 may store magnetometer calibration parameters such as, for example, the soft-iron matrix W and the hard-iron vector b, already discussed. Gyroscope storage 98 may optionally store gyroscope calibration parameters such as, for example, the gyroscope measurement offset. In this regard, the calibrator 94 may calibrate (as shown by dashed lines) an offset of the gyroscope 84 when the gyroscope 84 is un-calibrated. The illustrated apparatus 88 also includes a magnetometer controller 100 to increase the sampling rate of the magnetometer 82 before obtaining the second sensor data and decrease the sampling rate of the magnetometer 82 after calibration of the magnetometer 82. In one example, the apparatus 88 further includes a gyroscope controller 102 to activate the gyroscope 84 before obtaining the first sensor data and deactivate the gyroscope 84 after calibration of the magnetometer 82. Additionally, a motion detector 104 may detect rotation events associated with the magnetometer 82, wherein the second sensor data is obtained in response to the rotation events.

Additional Notes and Examples

Example 1 may include a geomagnetic field measurement system comprising a magnetometer, a gyroscope, a circuit board including one or more hard-iron effect components and one or more soft-iron effect components, and an integrated sensor apparatus comprising a gyroscope monitor to obtain first sensor data associated with the gyroscope, a magnetometer monitor to obtain second sensor data associated with the magnetometer, and a calibrator to use the first sensor data, the second sensor data and an extended Kalman filter to calibrate the magnetometer.

Example 2 may include the system of Example 1, wherein the integrated sensor apparatus further includes a magnetometer controller to increase a sampling rate of the magnetometer before obtaining the second sensor data and decrease the sampling rate of the magnetometer after calibration of the magnetometer.

Example 3 may include the system of Example 1, wherein the integrated sensor apparatus further includes a gyroscope controller to activate the gyroscope before obtaining the first sensor data and deactivate the gyroscope after calibration of the magnetometer.

Example 4 may include the system of Example 1, wherein the gyroscope is a calibrated gyroscope.

Example 5 may include the system of Example 1, wherein the gyroscope is an un-calibrated gyroscope, and wherein the calibrator is to calibrate an offset of the gyroscope.

Example 6 may include the system of any one of Examples 1 to 5, wherein the calibrator is to determine one or more soft-iron calibration parameters and one or more hard-iron calibration parameters for the extended Kalman filter.

Example 7 may include a calibration apparatus comprising a gyroscope monitor to obtain first sensor data associated with a gyroscope, a magnetometer monitor to obtain second sensor data associated with a magnetometer and a calibrator to use the first sensor data, the second sensor data and an extended Kalman filter to calibrate the magnetometer.

Example 8 may include the apparatus of Example 7, further including a magnetometer controller to increase a sampling rate of the magnetometer before obtaining the second sensor data and decrease the sampling rate of the magnetometer after calibration of the magnetometer.

Example 9 may include the apparatus of Example 7, further including a gyroscope controller to activate the gyroscope before obtaining the first sensor data and deactivate the gyroscope after calibration of the magnetometer.

Example 10 may include the apparatus of Example 7, wherein the first sensor data is to be obtained from a calibrated gyroscope.

Example 11 may include the apparatus of Example 7, wherein the first sensor data is to be obtained from an un-calibrated gyroscope, and wherein the calibrator is to calibrate an offset of the gyroscope.

Example 12 may include the apparatus of any one of Examples 7 to 11, wherein the calibrator is to determine one or more soft-iron calibration parameters and one or more hard-iron calibration parameters for the extended Kalman filter.

Example 13 may include a method of operating a calibration apparatus, comprising obtaining first sensor data associated with a gyroscope, obtaining second sensor data associated with a magnetometer and using the first sensor data, the second sensor data and an extended Kalman filter to calibrate the magnetometer.

Example 14 may include the method of Example 13, further including increasing a sampling rate of the magnetometer before obtaining the second sensor data, and decreasing the sampling rate of the magnetometer after calibration of the magnetometer.

Example 15 may include the method of Example 13, further including activating the gyroscope before obtaining the first sensor data, and deactivating the gyroscope after calibration of the magnetometer.

Example 16 may include the method of Example 13, wherein the first sensor data is obtained from a calibrated gyroscope.

Example 17 may include the method of Example 13, wherein the first sensor data is obtained from an un-calibrated gyroscope, the method further including calibrating an offset of the gyroscope.

Example 18 may include the method of any one of Examples 13 to 17, further including determining one or more soft-iron calibration parameters and one or more hard-iron calibration parameters for the extended Kalman filter.

Example 19 may include at least one computer readable storage medium comprising a set of instructions which, when executed by a computing device, cause the computing device to obtain first sensor data associated with a gyroscope, obtain second sensor data associated with a magnetometer and use the first sensor data, the second sensor data and an extended Kalman filter to calibrate the magnetometer.

Example 20 may include the at least one computer readable storage medium of Example 19, wherein the instructions, when executed, cause a computing device to increase a sampling rate of the magnetometer before obtaining the second sensor data, and decrease the sampling rate of the magnetometer after calibration of the magnetometer.

Example 21 may include the at least one computer readable storage medium of Example 19, wherein the instructions, when executed, cause a computing device to activate the gyroscope before obtaining the first sensor data, and deactivate the gyroscope after calibration of the magnetometer.

Example 22 may include the at least one computer readable storage medium of Example 19, wherein the first sensor data is to be obtained from a calibrated gyroscope.

Example 23 may include the at least one computer readable storage medium of Example 19, wherein the first sensor data is to be obtained from an un-calibrated gyroscope, and wherein the instructions, when executed, cause a computing device to calibrate an offset of the gyroscope.

Example 24 may include the at least one computer readable storage medium of any one of Examples 19 to 23, wherein the instructions, when executed, cause a computing device to determine one or more soft-iron calibration parameters and one or more hard-iron calibration parameters for the extended Kalman filter.

Example 25 may include a calibration apparatus comprising means for obtaining first sensor data associated with a gyroscope, means for obtaining second sensor data associated with a magnetometer, and means for using the first sensor data, the second sensor data and an extended Kalman filter to calibrate the magnetometer.

Example 26 may include the apparatus of Example 25, further including means for increasing a sampling rate of the magnetometer before obtaining the second sensor data, and means for decreasing the sampling rate of the magnetometer after calibration of the magnetometer.

Example 27 may include the apparatus of Example 25, further including means for activating the gyroscope before obtaining the first sensor data, and means for deactivating the gyroscope after calibration of the magnetometer.

Example 28 may include the apparatus of Example 25, wherein the first sensor data is to be obtained from a calibrated gyroscope.

Example 29 may include the apparatus of Example 25, wherein the first sensor data is to be obtained from an un-calibrated gyroscope, the apparatus further including means for calibrating an offset of the gyroscope.

Example 30 may include the apparatus of any one of Examples 25 to 29, further including means for determining one or more soft-iron calibration parameters and one or more hard-iron calibration parameters for the extended Kalman filter.

Thus, techniques may provide magnetometer calibration that works well with insufficient and unevenly distributed data. Additionally, the calibration may be conducted based on small motions such as, for example, walking with, picking up and/or putting down the device containing the magnetometer. Techniques may also provide for magnetometer calibration in the background, with parameters being updated autonomously (e.g., without prompting the user to perform awkward, inconvenient or complex gestures). Moreover, calibration results and parameters (e.g., hard-iron vectors, soft-iron matrices) may be output quickly (e.g., with minimal rotation). The magnetometer calibration may also work well with both calibrated gyroscopes and un-calibrated gyroscopes. Additionally, during calibration, computations may be evenly distributed into every sample due to EKF computations being the same in each iteration.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A, B, C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:
1. A system comprising:
a magnetometer;
a gyroscope;

a circuit board including one or more magnetized ferromagnetic components and one or more un-magnetized ferromagnetic components; and an integrated sensor hub comprising, a gyroscope monitor to obtain first sensor data associated with the gyroscope, a magnetometer monitor to obtain second sensor data associated with the magnetometer, wherein the second sensor data is impacted by a soft-iron effect and a hard-iron effect, and a calibrator to use the first sensor data, the second sensor data and an extended Kalman filter to calibrate the magnetometer, wherein the extended Kalman filter uses a linear state transition model and a non-linear observation function to determine a calibrated magnetometer measurement, a soft-iron matrix and a hard-iron vector, and wherein one or more changes in the calibrated magnetometer measurement are to align with a change in an orientation measured by the gyroscope, and the one or more changes in the calibrated magnetometer measurement are to be located on a surface of a sphere.

2. The system of claim 1, wherein the integrated sensor hub further includes a magnetometer controller to increase a sampling rate of the magnetometer before obtaining the second sensor data and decrease the sampling rate of the magnetometer after calibration of the magnetometer.

3. The system of claim 1, wherein the integrated sensor hub further includes a gyroscope controller to activate the gyroscope before obtaining the first sensor data and deactivate the gyroscope after calibration of the magnetometer.

4. The system of claim 1, wherein the gyroscope is a calibrated gyroscope.

5. The system of claim 1, wherein the gyroscope is an uncalibrated gyroscope, and wherein the calibrator is to calibrate an offset of the gyroscope.

6. The system of claim 1, wherein the integrated sensor hub further includes a motion detector to detect a rotation event associated with the magnetometer, and wherein the second sensor data is to be obtained in response to the rotation event.

7. An apparatus comprising:

a gyroscope monitor to obtain first sensor data associated with a gyroscope;

a magnetometer monitor to obtain second sensor data associated with a magnetometer, wherein the second sensor data is impacted by a soft-iron effect and a hard-iron effect; and a calibrator to use the first sensor data, the second sensor data and an extended Kalman filter to calibrate the magnetometer, wherein the extended Kalman filter uses a linear state transition model and a non-linear observation function to determine a calibrated magnetometer measurement, a soft-iron matrix and a hard-iron vector, and wherein one or more changes in the calibrated magnetometer measurement are to align with a change in an orientation measured by the gyroscope, and the one or more changes in the calibrated magnetometer measurement are to be located on a surface of a sphere.

8. The apparatus of claim 7, further including a magnetometer controller to increase a sampling rate of the magnetometer before obtaining the second sensor data and decrease the sampling rate of the magnetometer after calibration of the magnetometer.

9. The apparatus of claim 7, further including a gyroscope controller to activate the gyroscope before obtaining the first sensor data and deactivate the gyroscope after calibration of the magnetometer.

10. The apparatus of claim 7, wherein the first sensor data is to be obtained from a calibrated gyroscope.

11. The apparatus of claim 7, wherein the first sensor data is to be obtained from an uncalibrated gyroscope, and wherein the calibrator is to calibrate an offset of the gyroscope.

12. The apparatus of claim 7, further including a motion detector to detect a rotation event associated with the magnetometer, wherein the second sensor data is to be obtained in response to the rotation event.

13. A method comprising:

obtaining, via a gyroscope monitor, first sensor data associated with a gyroscope;

obtaining, via a magnetometer, second sensor data associated with the magnetometer, wherein the second sensor data is impacted by a soft-iron effect and a hard-iron effect; and using the first sensor data, the second sensor data and an extended Kalman filter to calibrate the magnetometer, wherein the extended Kalman filter is to use a linear state transition model and a non-linear observation function to determine a calibrated magnetometer measurement, a soft-iron matrix and a hard-iron vector, and wherein one or more changes in the calibrated magnetometer measurement aligns with a change in an orientation measured by the gyroscope, and the one or more changes in the calibrated magnetometer measurement are to be located on a surface of a sphere.

14. The method of claim 13, further including:

increasing a sampling rate of the magnetometer before obtaining the second sensor data; and decreasing the sampling rate of the magnetometer after calibration of the magnetometer.

15. The method of claim 13, further including:

activating the gyroscope before obtaining the first sensor data; and deactivating the gyroscope after calibration of the magnetometer.

16. The method of claim 13, wherein the first sensor data is obtained from a calibrated gyroscope.

17. The method of claim 13, wherein the first sensor data is obtained from an uncalibrated gyroscope, the method further including calibrating an offset of the gyroscope.

18. The method of claim 13, wherein the second sensor data is obtained in response to a rotation event associated with the magnetometer.

19. At least one non-transitory computer readable storage medium comprising a set of instructions which, when executed by a computing device, cause the computing device to:

obtain first sensor data associated with a gyroscope;

obtain second sensor data associated with a magnetometer, wherein the second sensor data is impacted by a soft-iron effect and a hard-iron effect;

use the first sensor data, the second sensor data and an extended Kalman filter to calibrate the magnetometer, wherein the extended Kalman filter uses a linear state transition model and a non-linear observation function to determine a calibrated magnetometer measurement, a soft-iron matrix and a hard-iron vector, and wherein one or more changes in the calibrated magnetometer measurement are to align with a change in an orientation measured by the gyroscope, and the one or more changes in the calibrated magnetometer measurement are to be located on a surface of a sphere.

20. The at least one non-transitory computer readable storage medium of claim 19, wherein the instructions, when executed, cause a computing device to:
   increase a sampling rate of the magnetometer before obtaining the second sensor data; and
   decrease the sampling rate of the magnetometer after calibration of the magnetometer.

21. The at least one non-transitory computer readable storage medium of claim 19, wherein the instructions, when executed, cause a computing device to:
   activate the gyroscope before obtaining the first sensor data; and
   deactivate the gyroscope after calibration of the magnetometer.

22. The at least one non-transitory computer readable storage medium of claim 19, wherein the first sensor data is to be obtained from a calibrated gyroscope.

23. The at least one non-transitory computer readable storage medium of claim 19, wherein the first sensor data is to be obtained from an uncalibrated gyroscope, and wherein the instructions, when executed, cause a computing device to calibrate an offset of the gyroscope.

24. The at least one non-transitory computer readable storage medium of claim 19, wherein the second sensor data is to be obtained in response to a rotation event associated with the magnetometer.

* * * * *